United States Patent [19]
Favre et al.

[11] Patent Number: 5,347,527
[45] Date of Patent: Sep. 13, 1994

[54] PROCESS OF ADJUSTMENT OF A CONTINUOUSLY TUNABLE LIGHT SOURCE

[75] Inventors: François Favre, Perros Guirec; Daniel Le Guen, Louannec, both of France

[73] Assignee: France Telecom, Paris, France

[21] Appl. No.: 45,098

[22] Filed: Apr. 12, 1993

[30] Foreign Application Priority Data

Apr. 13, 1992 [FR] France .................. 92 04514

[51] Int. Cl.$^5$ ............................................ H01S 3/10
[52] U.S. Cl. .............................. 372/20; 372/29; 372/32; 372/102
[58] Field of Search ............... 372/20, 32, 29, 102

[56] References Cited

FOREIGN PATENT DOCUMENTS 2595013  2/2486  France .

OTHER PUBLICATIONS

Favre, F., and Le Guen, L., "82 nm of Continuous Tunability for an External Cavity Semiconductor Laser", *Electronics Letters*, vol. 27, No. 2, Jan. 17, 1991, pp. 183–184.

*Primary Examiner*—Georgia Y. Epps
*Attorney, Agent, or Firm*—Mason, Fenwick & Lawrence

[57] ABSTRACT

This invention relates to a continuously tunable external cavity light source and a process for adjusting the source. The source includes a laser, a diffraction grating placed on the laser's axis that together with the laser forms an external cavity, and an arm rigidly connected to the diffraction grating and having a mobile end permanently in contact with a slide plane perpendicular to the laser's optical axis. The source is tuned by shifting the diffraction grating. Fine adjustment of the slide plane is achieved by simultaneously rotating the grating and measuring the emissive power of the source as a function of the grating rotation. The number of jumps of the emissive power is counted with respect to the current injected, fine adjustment means are used in accordance with result of the count, and the counting and fine adjustment steps are repeated until the result of the count is zero.

10 Claims, 2 Drawing Sheets

PROCESS OF ADJUSTMENT OF A CONTINUOUSLY TUNABLE LIGHT SOURCE

BACKGROUND OF THE INVENTION

1. Field of the Invention

This invention relates to a tunable external cavity light source and a process for adjusting such a source.

2. Related Art

Continuously tunable light sources allow many uses, particularly in optical telecommunications, for example in multi-channel coherent communication systems, for spectroscopic measurements, and for laser and optical amplifier characterizations.

A continuously tunable light source has been described in French Patent No. FR-2 595 013, and more recently in an article by the inventors of the present application published in the review "Electronics Letters" of 17 Jan. 1991 (Vol. 27; No. 2. pp. 183-184).

The source described in these publications comprises a semiconductor laser with a first antireflection coated facet.

The second facet of this laser forms a resonant cavity with a diffraction grating.

The shifting of this grating, by combined rotation/-translation, in predetermined conditions, allows to obtain the continuous tuning of the source.

These grating shifting conditions must be satisfied with great accuracy, and require the adjustment of mechanical components after the complete assembly of the source, regularly and even, preferably, frequently during its use.

Until now, the making of these adjustments was considered as particularly delicate, and no satisfactory method had been devised to permit the simple and routine use of such a source.

SUMMARY OF THE INVENTION

The object of the present invention is to correct these drawbacks.

To achieve this, the invention relates to a process of adjustment of a continuously tunable external cavity light source, said source comprising:

a laser with an optical axis and a first and a second facet, the first facet having a low reflection coefficient, a diffraction grating placed on the axis of the laser, on the side of the first facet, rotatable about an axis intersecting the laser axis at right-angles, and, with the second facet of the laser, forming the external cavity, an arm rigidly connected to the grating having a mobile end which is in permanent contact with a slide plane perpendicular to the optical axis of the laser, means of fine adjustment of the slide plane with respect to the laser, the tuning of the source being achieved by a shifting of the grating.

According to the invention:

(a) an approximate adjustment is made of the rotation and position of the slide plane, (b) the grating is rotated and, simultaneously, the emissive power of the source is measured with respect to the current injected as a function of the rotation of the grating, (c) the number of emissive power jumps is counted with respect to the current injected during the rotation of the grating, each jump being given a sign depending on its direction, (d) the fine adjustment means are used in accordance with the result of the count, (e) operations (b), (c) and (d) are repeated until the count result is zero.

Preferably, the number of jumps is then counted, independent of their direction, and the fine adjustment means are then used until the number of jumps is zero.

The process of the invention preferably exhitis the following characteristics, separately or in combination:

the emissive power is measured by sampling a part of the light flux emitted, the emissive power is locked to a constant value, and the current injected controlling the laser is measured, the adjustment is automated, the fine adjustment means are actuated automatically based on the emissive power of the source with respect to the injected current.

The invention also concerns a light source allowing simple implementation of the process of the invention.

It comprises, a laser with an optical axis and a first and a second facet, the first facet having a low reflection coefficient, a diffraction grating placed on the axis of the laser, on the side of the first facet, rotatable about an axis intersecting the laser axis at right-angles, and, with the second facet of the laser, forming the external cavity, an arm rigidly connected to the grating having a mobile end which is in permanent contact with a slide plane perpendicular to the optical axis of the laser, means of fine adjustment of the slide plane with respect to the laser, the tuning of the source being achieved by a shifting of the grating.

According to the invention, the light source comprises:

means of sampling a portion of the flux emitted, a photodetector receiving the sampled flux, means of processing the electric signal from the photodetector, means of controlling the fine adjustment means based on a signal generated by the processing means.

Preferably, this source exhibits the following characteristics, separately or in combination.

During the adjustment, the processing means lock the emissive power at a fixed value.

During the adjustment, the processing means:

(a) cause the shifting of the grating, (b) simultaneously measure the emissive power of the source with respect to the injected current, (c) count the number of jumps of emissive power with respect to the current injected during the rotation of the grating, each jump being given a sign depending on its direction, (d) act on the fine adjustment means in accordance with the result of the count, (e) repeat operations (a) to (d) until the result of the count is zero.

Preferably, the processing means:

count the number of jumps, independent of their direction, act on the control means until the number of jumps is sero.

BRIEF DESCRIPTION OF THE DRAWING

An embodiment of the invention is described below in detail, by reference to the appended drawings, in which.

DETAILED DESCRIPTION OF PREFERRED EMBODIMENTS

Figure 1:
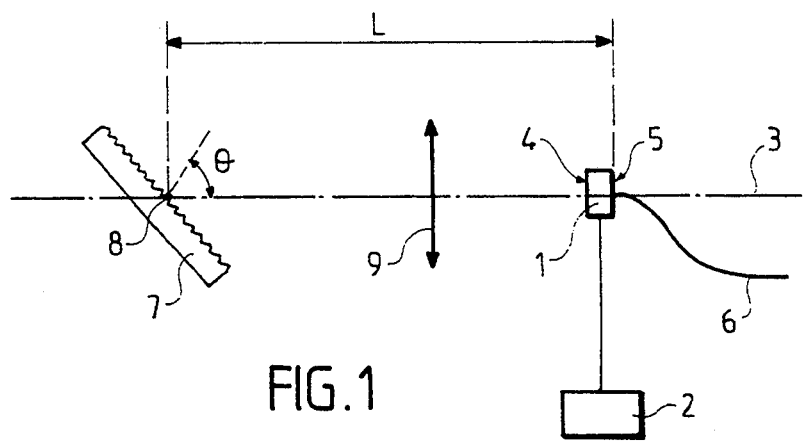
FIG. 1 is a schematic illustration of a tunable external cavity source.
Figure 2:
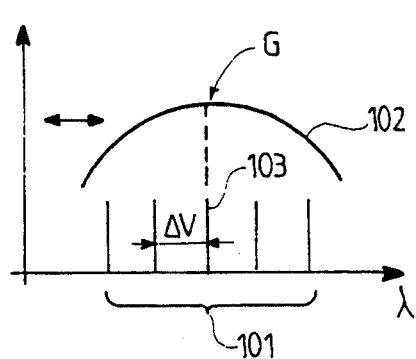
FIG. 2 is an indicative diagram showing the gain of the source as a function of the wavelength.

FIG. 1 shows an external cavity light source. A laser 1 controlled by a power source 2 has an optical axis 3. It comprises a first low reflection facet 4, and a second facet 5 coupled with an optical fiber 6.

The laser 1 is a semiconductor laser and the first facet 4 has an antireflection multi-layer coating.

A diffraction grating 7 is placed on the optical axis 3 of the laser 1 on the side of the first facet 4 of the laser. This grating, with the fact 5 of the laser 1, forms an external cavity with an equivalent optical length L'.

This equivalent optical length L' depends directly on the geometric distance L between the grating and the second facet 5 of the laser 1.

The grating 7 can be rotated about an axis 8 intersecting the axis 3 of the laser at 90 degrees.

An optical system 9 may be inserted between the laser 1 and the grating 7, in order to collimate the light flux emitted by the laser and to ensure suitable operation of the grating 7.

The cavity formed by the facet 5 of the laser 1 and the grating 7, which can be treated as a mirror for the time being, resonates for modes of which the frequency shift is given by the formula:

$$\Delta\delta = c/2L'$$

where c is the speed of light and L' the length of the resonator. These resonant modes are centered on the frequencies and wavelengths shown roughly by reference 101 in FIGS. 2 to 5.

Furthermore, the grating 7 has a response as a function of the wavelength or the light frequency, represented by the reference 102 in FIGS. 2 to 5. This curve is centered on the wavelength given by the formula:

$$\lambda = 2a \sin \Theta$$

where a is the grating pitch and $\Theta$ the incident angle of the light beam, that is to say the angle of the normal to the grating with the optical axis 3 of the laser 1.

In practice, in such a device, the mode of the resonant cavity which benefits from the highest gain by the effect of the grating 103 determines the emission wavelength $\lambda$ of the source.

Figure 3:
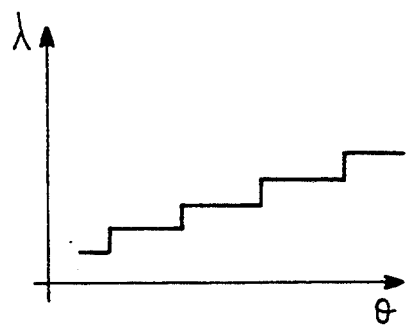
FIG. 3 is a representation of the emission wavelength of an external cavity source as a function of the shifting of the grating about a fixed axis, FIGS. 4 and 5 each show the gain of a continuously tunable external cavity source for two grating positions and rotations.

Thus, for a given optical length L' of the cavity, this source emission wavelength $\lambda$ varies discontinuously, as shown in FIG. 3, during a continuous variation of the angle of rotation $\Theta$ of the grating 7.

In fact, the rotation of the grating 7 causes a shift of its response curve 102, parallel to the axis of the $\lambda$ which causes the successive pre-eminence of the different modes 101.

In a continuously tunable source, simultaneously with the rotation of the grating 7 which causes the shifting of the curve 102, the optical length L' of the resonant cavity is modified, so that the preferential mode 103 follows the shift of the curve 102.

The joint shift is obtained by combination of the formulae indicated above, when the condition L'=ma sin $\Theta$ is satisfied (where m is a whole number).

Figure 4:
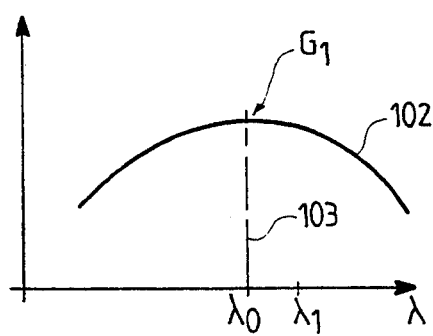
Figure 5:
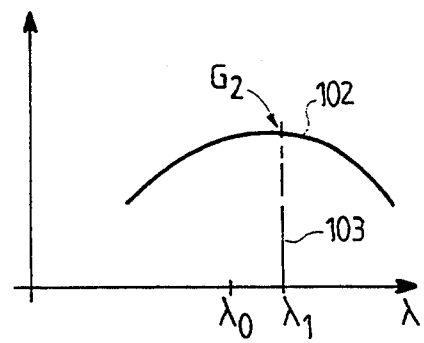

Accordingly, as shown in FIGS. 4 and 5, the shifting of the grating 7 occurs from a first position (FIG. 4) to a second (FIG. 5). The response 102 of the grating 7 and the resonant mode 103 of the external cavity are simultaneously shifted, and the emission wavelength of the source goes from $\lambda_0$ to $\lambda_1$ without significant modification of the gain ($G_1 = G_2$).

It is well known that this condition can be satisfied by rigidly fixing the grating 7 to a mobile arm 10, of which one end 11 is kept in permanent contact with a slide plane 12 perpendicular to the optical axis 3.

Figure 6:
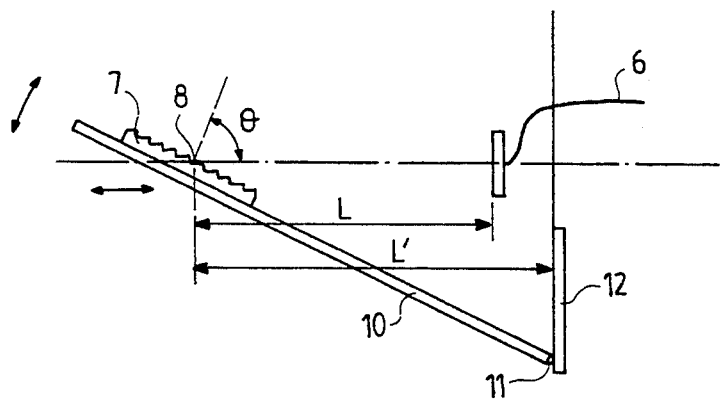
FIG. 6 is a schematic illustration of the shifting of the grating during the tuning variation.

L' is accordingly the distance between the intersection of the grating 7 with the axis 3 of the laser 1 and the slide plane 12 (FIG. 6).

When this slide plane 12 is suitably positioned, both in rotation and in position with respect to the optical axis 3, the equation mentioned above between the rotation angle $\Theta$ of the grating 7 and the length L of the resonant cavity is satisfied.

The precise adjustment of this rotation and/or this position of the slide plane 12 is difficult to achieve, and no proposal had yet been made to facilitate this adjustment.

Whereas hitherto it was customary to observe the variation in the emission wavelength of the source with the grating rotation angle, as shown in FIG. 3, until continuous tuning was obtained by successive approximations, it has been found with some surprise that the measurement of the emissive power of the source, with respect to the current and not its wavelength, as a function of the rotation of the grating, allows to make this adjustment easily and in satisfactory conditions.

Thus, an approximate adjustment is first made of the rotation of the position of the slide plane. This approximate adjustment can result from the mechanical assembly itself. Rough adjustments can also be considered, fixed once and for all, in the construction of the source.

The source comprises the fine adjustment means 13 acting on the rotation and/or position of the slide plane 12.

These fine adjustment means 13 comprise a component 14, mobile in rotation about an axis 15 by the action of a micrometer screw 16. This component 14 supports the slide plane 12.

The source adjustment procedure which allows to satisfy the condition of continuous tunability is the following.

The grating 7 is rotated and a measurement is taken, with possible recording, of the emissive power of the source with respect to the current injected as a function of the position of the grating.

In fact, it has been found that the emissive power of the source, or, more precisely, its ratio to the current injected by the power source 2, displays jumps during the passage of the resonance of the cavity from one mode to another.

Accordingly, in this adjustment procedure, an attempt is made to position the plane 12 in such a way that these jumps no longer exist.

To do this, the direction and number of jumps of emissive power are measured with respect to the current injected during the movement of the grating 7.

The number of jumps is counted algebraically by allocating a sign to each depending on its direction.

The fine adjustment means are then used in accordance with the result of this count.

In fact, it has been postulated by theory and found by experience that the direction of the jumps, that is to say their sign, determines the direction of movement of the slide plane 12 which must be produced to decrease the amplitude of these jumps.

After having made this adjustment, the preceding operations are repeated, the grating is rotated, the sign and number of jumps are measured, their algebraic total is calculated, and a new adjustment is then carried out, until the result of the count is zero.

However, this adjustment may lead to a multi-mode resonance mode, in which the jumps of a given amplitude in a direction are offset, in the cumulative total, by jumps of the same amplitude in the other direction.

To avoid the setting of the source on a multi-mode resonance, it is accordingly advisable to cumulate also the absolute values of the number of jumps, and to employ the adjustment means to minimize and even nullify this cumulative total. This new adjustment, while it may be necessary, does not affect the previous adjustment.

In this way, by rotation and movement of the grating 7, a continuously tunable source is obtained.

So far, we have indicated that the adjustment of the source is made by considering its emissive power with respect to the current injected. In fact, these two parameters are inter-dependent.

In practice, it is preferable to keep the emissive power constant by a control system and to measure the current injected.

The injected current can also be fixed and the emissive power measured.

The curves showing respectively the current injected as a function of the rotation and position of the grating 7 at constant luminosity, and the light transmission capacity, also as a function of the rotation and position of the grating 7, are complementary.

The process of adjustment of the tunable external cavity light source can advantageously be automated, in which case the fine adjustment means 13 are actuated on the basis of the emissive power with respect to the current injected.

Figure 7:
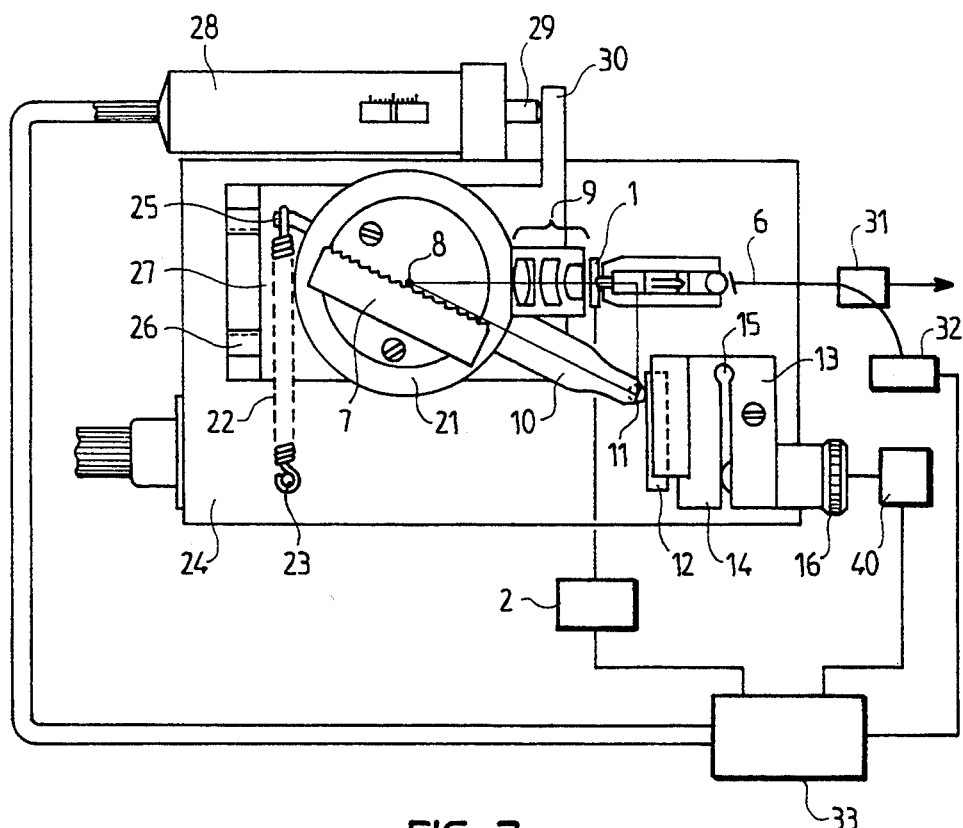
FIG. 7 shows the source according to the invention.

The source, shown in FIG. 7, comprises a laser 5 controlled by an electric power source 2, a grating 7, and an optical system 9.

The slide plane 12 is fixed to the component 14 of the positioning means 13 actuated by the micrometer screw 16.

The grating 7 is supported by a revolving stage 21 integral with the arm 10. A spring 22 is fixed at one end by a fastener 23 to the base 24 of the source, and at its other end to a finger 25 fixed to the revolving stage 21.

The action of the spring 22 maintains the end 11 of the arm 10 in contact with the plane 12. The revolving stage 21 is itself fixed on a translation movement, comprising a connector 26 fixed to the base 24 and a mobile component 27 which supports the revolving stage 21.

The motor 28 controlling the cylinder rod 29 is capable of producing the movement of the translation means 26, 27 by pressing on finger 30 integral with the translation component 27.

It is accordingly clear that the motor 28, producing the movement of the translation component 27, drives the grating 7, thus modifying the length of the resonant cavity of the source. Simultaneously, the arm 10, bearing on the reference plane 12, produces the rotation of the grating 7 about its axis 8, and, thereby, the shift of the transfer curve 102.

The fine adjustment of the source, that is to say of the position of the slide plane 12, is advantageously automated.

To do this, a separator 31 samples a part of the flux emitted by the source and sends it to the photodetector 32. The electrical signal generated by this photodetector is transmitted to a processing unit 33 which, on the one hand, controls the electric power source 2 and determines the current injected into the laser, so that the strength of the light flux from the source is constant, irrespective of the position of the grating 7.

On the other hand, the processing unit 33 is capable of controlling calibration operations according to which, by the action of the motor 28, the translation and rotation movement of the grating 7 is produced, the measurement of the current injected by the source 2 as a function of the rotation of the grating 7 is taken, the sign and number of jumps of the current injected are counted and algebraically cumulated, and a signal is sent by the processing means 33 as a function of the result of this cumulative total to the control unit 40 of the micrometer, screw 16, so as to minimize the accumulation of the number of these jumps.

As indicated above in the description of the process, the processing means 33 advantageously calculate the cumulative total of the absolute value of the number of jumps, in order to control the micrometer screw 16 by means of the control means 40, and to avoid a multimode resonance of the cavity.

The invention thus proposes a particularly simple process of adjustment of a tunable source.

As an indication, let us point out that a source has been made achieving wavelength tunability without mode hopping of 82 nm, with a semiconductor laser emitting around 1540 nm.

The reflectivity of the first facet 4 of the laser is less than $10^{-3}$ between 1500 and 1580 nm.

The reflectivity of the second facet 5 of the laser is about 0.32.

The grating is a plane grating comprising about 1200 lines per millimeter.

The optical system 9 has a focal length of 6 mm.

Various modifications of the adjustment process and of the source can be made without going outside the scope of the invention, and, in particular, the optical system 9 can advantageously be a catadioptric system.

What is claimed is:

1. A process of adjustment of a continuously tunable external cavity light source, said source comprising:
   a laser controlled by an injected current with an optical axis and a first and a second facet, the first facet having a low reflection coefficient,
   a diffraction grating placed on the axis of the laser, on the side of the first facet, rotatable about an axis intersecting the laser axis at right-angles, and, with the second facet of the laser, forming the external cavity,
   an arm rigidly connected to the grating having a mobile end which is in permanent contact with a slide plane perpendicular to the optical axis of the laser, means of fine adjustment of the slide plane with respect to the laser, the tunning of the source being achieved by a shifting of the grating, wherein:

(a) an approximate adjustment is made of the rotation and position of the slide plane, (b) the grating is rotated and, simultaneously, the emissive power of the source is measured with respect to the current injected as a function of the rotation of the grating, (c) the number of emissive power jumps is counted with respect to the current injected during the rotation of the grating, each jump being given a sign depending on its direction, (d) the fine adjustment means are used in accordance with the result of the count, (e) operations (b), (c) and (d) are repeated until the count result is zero.

2. Process of adjustment of a continuously tunable external cavity light source as claimed in claim 1, wherein:

the number of jumps is counted, independent of their direction, the fine adjustment means are used until the number of jumps is zero.

3. Process of adjustment of a continuously tunable external cavity light source as claimed in claim 1, wherein the emissive power is measured by sampling a portion of the light flux emitted.

4. Process of adjustment of a continuously tunable external cavity light source as claimed in claim 1, wherein the emissive power of the light source is locked at a constant value, and wherein the current injected, controlling the laser, is measured.

5. Process of adjustment of a continuously tunable external cavity light source as claimed in claim 1, wherein the adjustment is automated, the final adjustment means being actuated by automatic means based on the emissive power with respect to the current injected.

6. Process of adjustment of a continuously tunable external cavity light source as claimed in claim 1, wherein the adjustment is made permanently during the operation of the source.

7. Continuously tunable external cavity light source comprising:

a laser with an optical axis and a first and a second facet, the first facet having a low reflection coefficient, a diffraction grating placed on the axis of the laser, on the side of the first facet, rotatable about an axis intersecting the laser axis at right-angles, and, with the second facet of the laser, forming the external cavity, an arm rigidly connected to the grating having a mobile end which is in permanent contact with a slide plane perpendicular to the optical axis of the laser, means of fine adjustment of the slide plane with respect to the laser, the tuning of the source being achieved by a shifting of the grating, wherein it comprises:

means of sampling a portion of the flux emitted, a photodetector receiving the sampled flux, means of processing the electric signal from the photodetector, means of controlling the fine adjustment means based on a signal generated by the processing means.

8. Continuous tunable external cavity light source as claimed in claim 7, wherein, during the adjustment, the processing means lock the emissive power at a fixed value.

9. Continuously tunable external cavity light source as claimed in claim 7 wherein during the adjustment, the processing means:

(a) cause the rotation of the grating, (b) simultaneously measure the emissive power of the source, (c) count the number of jumps of emissive power with respect to the current injected during the rotation of the grating, each jump being given a sign depending on its direction, (d) act on the fine adjustment means in accordance with the result of the count, (e) repeat operations (a) to (d) until the result of the count is zero.

10. Continuously tunable external cavity light source as claimed in claim 8, wherein the processing means:

count the number of jumps, independent of their direction, act on the control means until the number of jumps is zero.

* * * * *